(12) United States Patent
Bower

(10) Patent No.: US 10,262,966 B2
(45) Date of Patent: *Apr. 16, 2019

(54) METHODS FOR SURFACE ATTACHMENT OF FLIPPED ACTIVE COMPONENTS

(71) Applicant: X-Celeprint Limited, Cork (IE)

(72) Inventor: Christopher Bower, Raleigh, NC (US)

(73) Assignee: X-Celeprint Limited, Cork (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/990,449

(22) Filed: May 25, 2018

(65) Prior Publication Data

US 2018/0277504 A1  Sep. 27, 2018

Related U.S. Application Data

(63) Continuation of application No. 15/423,159, filed on Feb. 2, 2017, now Pat. No. 10,008,465, which is a
(Continued)

(51) Int. Cl.
*H01L 23/00* (2006.01)
*H01L 23/31* (2006.01)
(Continued)

(52) U.S. Cl.
CPC .......... *H01L 24/13* (2013.01); *H01L 21/563* (2013.01); *H01L 21/6835* (2013.01);
(Continued)

(58) Field of Classification Search
CPC ......... H01L 31/18; H01L 24/11; H01L 51/56; H01L 21/28
See application file for complete search history.

(56) References Cited

U.S. PATENT DOCUMENTS 4,322,735 A   3/1982 Sadamasa et al.
4,330,329 A   5/1982 Hayashi et al.
(Continued)

FOREIGN PATENT DOCUMENTS

EP   1548571 A1   6/2005
GB   2 496 183 A   5/2013
(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).
(Continued)

*Primary Examiner* — Karen Kusumakar
(74) *Attorney, Agent, or Firm* — William R. Haulbrook; Michael D. Schmitt; Choate, Hall & Stewart LLP

(57) ABSTRACT

An active substrate includes a plurality of active components distributed over a surface of a destination substrate, each active component including a component substrate different from the destination substrate, and each active component having a circuit and connection posts on a process side of the component substrate. The connection posts may have a height that is greater than a base width thereof, and may be in electrical contact with the circuit and destination substrate contacts. The connection posts may extend through the surface of the destination substrate contacts into the destination substrate connection pads to electrically connect the connection posts to the destination substrate contacts.

21 Claims, 15 Drawing Sheets

Related U.S. Application Data continuation of application No. 14/821,046, filed on Aug. 7, 2015, now Pat. No. 9,603,259, which is a continuation of application No. 14/541,276, filed on Nov. 14, 2014, now Pat. No. 9,307,652, which is a continuation of application No. 13/491,196, filed on Jun. 7, 2012, now Pat. No. 8,889,485.

(60) Provisional application No. 61/494,507, filed on Jun. 8, 2011, provisional application No. 61/494,514, filed on Jun. 8, 2011.

(51) Int. Cl.
| | | |
|---|---|---|
| *H01L 25/065* | (2006.01) | |
| *H01L 25/07* | (2006.01) | |
| *H01L 25/04* | (2014.01) | |
| *H01L 21/56* | (2006.01) | |
| *H01L 21/683* | (2006.01) | |
| *H05K 3/20* | (2006.01) | |
| *H01L 25/075* | (2006.01) | |
| *H05K 1/18* | (2006.01) | |

(52) U.S. Cl.
CPC ...... *H01L 21/6838* (2013.01); *H01L 23/3157* (2013.01); *H01L 24/81* (2013.01); *H01L 24/95* (2013.01); *H01L 25/04* (2013.01); *H01L 25/0655* (2013.01); *H01L 25/072* (2013.01); *H01L 25/0753* (2013.01); *H05K 1/18* (2013.01); *H05K 3/20* (2013.01); *H01L 24/16* (2013.01); *H01L 24/32* (2013.01); *H01L 24/73* (2013.01); *H01L 24/92* (2013.01); *H01L 24/97* (2013.01); *H01L 2221/6834* (2013.01); *H01L 2221/68318* (2013.01); *H01L 2221/68327* (2013.01); *H01L 2221/68354* (2013.01); *H01L 2221/68368* (2013.01); *H01L 2221/68381* (2013.01); *H01L 2224/11002* (2013.01); *H01L 2224/13013* (2013.01); *H01L 2224/13017* (2013.01); *H01L 2224/13018* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2224/13184* (2013.01); *H01L 2224/16225* (2013.01); *H01L 2224/16227* (2013.01); *H01L 2224/29026* (2013.01); *H01L 2224/32225* (2013.01); *H01L 2224/73204* (2013.01); *H01L 2224/7698* (2013.01); *H01L 2224/81005* (2013.01); *H01L 2224/81193* (2013.01); *H01L 2224/81201* (2013.01); *H01L 2224/81203* (2013.01); *H01L 2224/81411* (2013.01); *H01L 2224/81815* (2013.01); *H01L 2224/83192* (2013.01); *H01L 2224/83855* (2013.01); *H01L 2224/9211* (2013.01); *H01L 2224/97* (2013.01); *H01L 2924/1205* (2013.01); *H01L 2924/12041* (2013.01); *H01L 2924/12042* (2013.01); *H01L 2924/12044* (2013.01); *H01L 2924/1304* (2013.01); *H01L 2924/14* (2013.01); *H01L 2924/15788* (2013.01); *Y10T 29/49128* (2015.01); *Y10T 156/1039* (2015.01)

(56) References Cited

U.S. PATENT DOCUMENTS

| | | |
|---|---|---|
| 4,591,659 A | 5/1986 | Leibowitz |
| 5,173,759 A | 12/1992 | Anzaki et al. |
| 5,550,066 A | 8/1996 | Tang et al. |
| 5,563,470 A | 10/1996 | Li |
| 5,621,555 A | 4/1997 | Park |
| 5,625,202 A | 4/1997 | Chai |
| 5,629,132 A | 5/1997 | Suzuki et al. |
| 5,686,790 A | 11/1997 | Curtin et al. |
| 5,739,800 A | 4/1998 | Lebby et al. |
| 5,748,161 A | 5/1998 | Lebby et al. |
| 5,780,933 A | 7/1998 | Ohmori et al. |
| 5,815,303 A | 9/1998 | Berlin |
| 5,821,571 A | 10/1998 | Lebby et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,422,716 B2 | 7/2002 | Henrici et al. |
| 6,424,028 B1 | 7/2002 | Dickinson |
| 6,466,281 B1 | 10/2002 | Huang et al. |
| 6,504,180 B1 | 1/2003 | Heremans et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,825,559 B2 | 11/2004 | Mishra et al. |
| 6,828,724 B2 | 12/2004 | Burroughes |
| 6,853,411 B2 | 2/2005 | Freidhoff et al. |
| 6,897,855 B1 | 5/2005 | Matthies et al. |
| 6,933,532 B2 | 8/2005 | Arnold et al. |
| 6,936,855 B1 | 8/2005 | Harrah |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,169,652 B2 | 1/2007 | Kimura |
| 7,195,733 B2 | 3/2007 | Rogers et al. |
| 7,259,391 B2 | 8/2007 | Liu et al. |
| 7,288,753 B2 | 10/2007 | Cok |
| 7,394,194 B2 | 7/2008 | Cok |
| 7,402,951 B2 | 7/2008 | Cok |
| 7,420,221 B2 | 9/2008 | Nagai |
| 7,466,075 B2 | 12/2008 | Cok et al. |
| 7,479,731 B2 | 1/2009 | Udagawa |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,605,452 B2 | 10/2009 | Yamanaka et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |

(56) References Cited

U.S. PATENT DOCUMENTS

| | | |
|---|---|---|
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,519,543 B1 | 8/2013 | Song et al. |
| 8,531,642 B2 | 9/2013 | Kiryuschev et al. |
| 8,605,452 B2 | 12/2013 | Tang |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,946,760 B2 | 2/2015 | Kim |
| 8,987,765 B2 | 3/2015 | Bibl et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,217,541 B2 | 12/2015 | Bathurst et al. |
| 9,308,649 B2 | 4/2016 | Golda et al. |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,741,785 B2 | 8/2017 | Bower et al. |
| 10,008,465 B2 | 6/2018 | Bower |
| 2001/0022564 A1 | 9/2001 | Youngquist et al. |
| 2002/0096994 A1 | 7/2002 | Iwafuchi et al. |
| 2003/0211649 A1 | 11/2003 | Hirai et al. |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0055864 A1 | 3/2006 | Matsumura et al. |
| 2006/0063309 A1 | 3/2006 | Sugiyama et al. |
| 2006/0116046 A1 | 6/2006 | Morley et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0006843 A1 | 1/2008 | Dai et al. |
| 2008/0108171 A1 | 5/2008 | Rogers et al. |
| 2008/0211734 A1 | 9/2008 | Huitema et al. |
| 2008/0224153 A1 | 9/2008 | Tomoda |
| 2009/0023243 A1 | 1/2009 | Koyanagi |
| 2009/0053498 A1 | 2/2009 | Matsuura et al. |
| 2009/0278141 A1 | 11/2009 | Coe-Sullivan et al. |
| 2009/0278142 A1 | 11/2009 | Watanabe et al. |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0186883 A1 | 7/2010 | Tomoda |
| 2010/0190293 A1 | 7/2010 | Maeda et al. |
| 2010/0207852 A1 | 8/2010 | Cok |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0264816 A1 | 10/2010 | Cok |
| 2010/0289115 A1 | 11/2010 | Akiyama et al. |
| 2010/0315319 A1 | 12/2010 | Cok et al. |
| 2010/0317132 A1 | 12/2010 | Rogers et al. |
| 2011/0043435 A1 | 2/2011 | Hebenstreit et al. |
| 2011/0067911 A1 | 3/2011 | Ishikawa et al. |
| 2011/0108800 A1 | 5/2011 | Pan |
| 2011/0133324 A1 | 6/2011 | Fan et al. |
| 2011/0211348 A1 | 9/2011 | Kim |
| 2011/0244225 A1 | 10/2011 | Hattori et al. |
| 2012/0080692 A1 | 4/2012 | Ohtorii |
| 2012/0119249 A1 | 5/2012 | Kim et al. |
| 2012/0141799 A1 | 6/2012 | Kub et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0256163 A1 | 10/2012 | Yoon et al. |
| 2012/0314388 A1 | 12/2012 | Bower et al. |
| 2012/0319563 A1 | 12/2012 | Ishihara et al. |
| 2012/0320581 A1 | 12/2012 | Rogers et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0309792 A1 | 11/2013 | Tischler et al. |
| 2013/0328190 A1 | 12/2013 | Wu et al. |
| 2014/0084482 A1 | 3/2014 | Hu et al. |
| 2014/0104243 A1 | 4/2014 | Sakariya et al. |
| 2014/0138543 A1 | 5/2014 | LaVeigne |
| 2014/0146273 A1 | 5/2014 | Kim et al. |
| 2014/0159065 A1 | 6/2014 | Hu et al. |
| 2014/0159066 A1 | 6/2014 | Hu et al. |
| 2014/0175498 A1 | 6/2014 | Lai |
| 2014/0183446 A1 | 7/2014 | Nago et al. |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0318328 A1 | 11/2015 | Bibl et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372393 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0086855 A1 | 3/2016 | Bower et al. |

(56) References Cited

U.S. PATENT DOCUMENTS

| | | |
|---|---|---|
| 2016/0093600 A1 | 3/2016 | Bower et al. |
| 2017/0025593 A1 | 1/2017 | Bower et al. |
| 2017/0187976 A1 | 6/2017 | Cok |
| 2017/0206845 A1 | 7/2017 | Sakariya et al. |
| 2017/0213803 A1 | 7/2017 | Bower |
| 2017/0250167 A1 | 8/2017 | Bower et al. |
| 2017/0256521 A1 | 9/2017 | Cok et al. |
| 2017/0287789 A1 | 10/2017 | Bower et al. |
| 2017/0309698 A1 | 10/2017 | Bower et al. |
| 2018/0151664 A1 | 5/2018 | Bower et al. |
| 2018/0226287 A1 | 8/2018 | Bower et al. |
| 2018/0286734 A1 | 10/2018 | Meitl et al. |
| 2018/0323178 A1 | 11/2018 | Meitl et al. |

FOREIGN PATENT DOCUMENTS

| | | |
|---|---|---|
| JP | H11-142878 A | 5/1999 |
| JP | 2011066130 A | 3/2011 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/102310 A2 | 9/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2016/046283 A2 | 3/2016 |
| WO | WO-2017/144573 A1 | 8/2017 |
| WO | WO-2018/091459 A1 | 5/2018 |

OTHER PUBLICATIONS

Elenius, Peter, Flip-Chip and Wire-Bond Interconnection Technologies, Chip Scale Review, Jul./Aug.:81-87 (2000).

Hamer et al., 63.2: AMOLED Displays Using Transfer-Printed Integrated Circuits, SID 09 Digest, 40(2):947-950 (2009).

Lee, M. S. et al., Optimization of copper pillar bump design for fine pitch flip-chip packages, Microsystems, Packaging, Assembly and Circuits Technology Conference 2009, IMPACT 2009, 4th International, pp. 128-131.

Lee, S. H. etal, Laser Lift-Off of GaN Thin Film and its Application to the Flexible Light Emitting Diodes, Proc. of SPIE 8460:846011-1-846011-6 (2012).

Lu, N. et al., Bio-Integrated Electronics, IEEE International Conference on IC Design & Technology, DOI: 10.1109/ICICDT.2014. 6838615, IEEE May 28, 2014, [retrieved on Jun. 17, 2014] pp. 1-5 (2014).

Ohno, Y. and Ohzeki, Y., Development of Ultrathin Bonding Wire for Fine Pitch Bonding, Nippon Steel Technical Report 59:1-5 (1993).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Yaniv et al., A 640 x 480 Pixel Computer Display Using Pin Diodes with Device Redundancy, 1988 International Display Research Conference, IEEE, CH-2678-1/88:152-154 (1988).

Cok, R. S. et al., AMOLED displays with transfer-printed integrated circuits, Journal of the SID, 19(4):335-341, (2011).

Cok, R. S. et al., Inorganic light-emitting diode displays using micro-transfer printing, Journal of the SID, 25(10):589-609, (2017).

METHODS FOR SURFACE ATTACHMENT OF FLIPPED ACTIVE COMPONENTS

CLAIM OF PRIORITY

The present application is a continuation of U.S. patent application Ser. No. 15/423,159, filed on Feb. 2, 2017, which is a continuation of U.S. patent application Ser. No. 14/821, 046, filed on Aug. 7, 2015, which is a continuation of U.S. patent application Ser. No. 14/541,276, filed on Nov. 14, 2014, now U.S. Pat. No. 9,307,652, which is a continuation of U.S. patent application Ser. No. 13/491,196, filed on Jun. 7, 2012, now U.S. Pat. No. 8,889,485, which claims priority under 35 U.S.C. § 119 to U.S. Provisional Patent Application Ser. No. 61/494,514 entitled "Methods for Surface Attachment of Flipped Active Components," filed on Jun. 8, 2011, the disclosure of which is incorporated by reference herein in its entirety.

CROSS REFERENCE TO RELATED APPLICATIONS

The present application is related to U.S. Provisional Patent Application Ser. No. 61/494,507 entitled "Substrates with Transferable Chiplets," filed on Jun. 8, 2011, the disclosure of which is incorporated by reference herein in its entirety.

FIELD

The present invention is directed to methods for providing substrates having separate electrically active components distributed thereon and related devices.

BACKGROUND

Substrates with electronically active components distributed over the extent of the substrate may be used in a variety of electronic systems, for example, flat-panel imaging devices such as flat-panel liquid crystal or organic light emitting diode (OLED) display devices. Substrates with electrically active components are also found in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photolithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle or Jade glass designed for display applications.

The above techniques may have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and increased material and processing costs. The choice of substrate materials may also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application 2010/0289115 and U.S. Patent Application 2010/0123134. However, such substrate materials can be more expensive and/or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled "Formation of Display Transistor Array Panel" describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate coated with an adhesive and thereby adhered to the destination substrate. The adhesive is subsequently cured. This method, however, may not locate the process side of the chiplets against the destination substrate. Thus, additional process steps may be needed to form patterned conductors that electrically connect the chiplets to destination-substrate circuitry. Moreover, chiplets with a variable topography may not be readily transferred.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to some aspects of the present invention, in a method for transferring active components from a source substrate to a destination substrate, a source substrate having a process side including active components therein or thereon is provided. The active components have respective primary surfaces including electrical connections thereon adjacent the process side and respective secondary surfaces opposite the primary surfaces. A first stamp having first pillars protruding therefrom is pressed against the active components on the process side of the source substrate to adhere the respective primary surfaces of the active components including the electrical connections thereon to respective transfer surfaces of the first pillars. A second stamp having second pillars protruding therefrom is pressed against the active components on the first pillars of the first stamp to adhere the respective secondary surfaces of the active components to respective transfer surfaces of the second pillars. The respective transfer surfaces of the second pillars have greater adhesive strength than those of the first pillars. The second stamp including the active components on the second pillars thereof is pressed against a destination substrate to adhere the respective primary surfaces of the active components including the electrical connections thereon to a receiving surface of the destination substrate, In some embodiments, the first pillars may be dimensioned such that the first pillars contact the active components between the electrical connections on the respective primary surfaces thereof.

In some embodiments, the respective surfaces of the second pillars may have a greater surface area than the respective surfaces of the first pillars.

In some embodiments, the second pillars may include a material having a greater adhesive strength per unit area than that of the first pillars.

In some embodiments, the second pillars may include vacuum collets configured to provide a vacuum strength greater than the adhesive strength of the first pillars to adhere the respective secondary surfaces of the active components thereto.

In some embodiments, the electrical connections may include conductive pads on the respective surfaces of the active components.

In some embodiments, the electrical connections may include conductive posts protruding from the respective surfaces of the active components.

In some embodiments, the electrical connections on the respective primary surfaces of the active components may be adhered to respective electrical contacts on the receiving surface of the destination substrate.

In some embodiments, the electrical connections on the respective primary surfaces of the active components may be adhered to the respective electrical contacts on the receiving surface of the destination substrate by an adhesive layer thereon.

In some embodiments, the electrical contacts on the destination substrate may include a conductive material softer than that of the electrical connections of the active components, and pressing the second stamp against the destination substrate may drive the electrical connections of the active components through the electrical contacts on the destination substrate.

According to one aspect of the present invention, a method for selectively transferring active components from a source substrate to a destination substrate comprises: providing a source substrate having a process side and a plurality of active components formed on or in the process side of the source substrate; providing a first stamp having a plurality of first pillars formed thereon and spatially aligned to the active components, each first pillar having a first area; pressing the first pillars against corresponding active components to adhere the active components to the first pillars; providing a second stamp having a plurality of second pillars spatially aligned to the first pillars, each second pillar having a second area larger than the first area; pressing the second pillars against corresponding active components to adhere the active components to the second pillars with van der Waal's forces; and pressing the active components against the destination substrate to adhere the active components to the destination substrate.

According to another aspect of the present invention, an active component comprises: a substrate having a process side; a circuit formed on the process side; connection posts formed on the process side, the connection posts electrically connected to the circuit; and wherein the connection posts have a base width, a height, a base area, and a peak area, and wherein the height is greater than the base width and the peak area is less than the base area.

According to yet another aspect of the present invention, an active substrate comprises: a destination substrate having a plurality of destination substrate contacts, the destination substrate contacts having a surface; a plurality of active components distributed over the destination substrate, each active component including a component substrate different from the destination substrate, each active component having a circuit and connection posts formed on a process side of the component substrate, wherein the connection posts have a base width and a height that is greater than the base width, wherein the connection posts are in electrical contact with the circuit and the destination substrate contacts; and wherein the connection posts are driven through the surface of the destination substrate contacts into the destination substrate connection pads to electrically connect the connection posts to the destination substrate contacts.

Embodiments of the present invention provide high-performance active components having variable topography over substrates with the process side of the chiplets in contact with a destination substrate.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

Figure 1A:
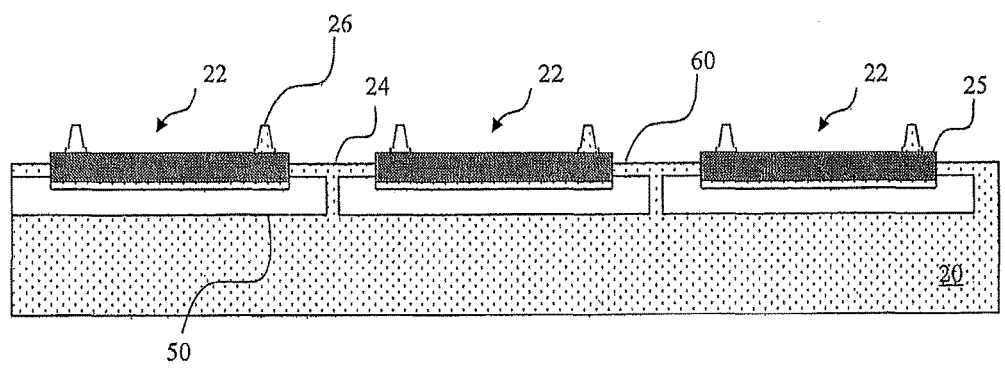
FIG. 1A is a schematic cross-section of a source substrate having a plurality of active components having post connections formed on a process side of the source substrate in accordance with embodiments of the present invention.

The figures are not drawn to scale since the individual elements of the drawings have too great a size variation to permit depiction to scale.

DETAILED DESCRIPTION OF EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "in contact with" or "connected to" or "coupled to" another element, it can be directly contacting or connected to or coupled to the other element or intervening elements may be present. In contrast, when an element is referred to as being "in direct contact with" or "directly connected to" or "directly coupled to" another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "under" or "lower" or "bottom," and "over" or "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Embodiments of the present invention provide methods and devices for the transfer of active components, also referred to herein as 'chiplets,' from a source substrate to a destination substrate. Chiplets are small integrated circuits, each integrated circuit having a separate and distinct substrate so as to define a separate transferable or printable electronic component. FIGS. 1-7 are schematic diagrams illustrating various fabrication operations according to embodiments the present invention, while FIG. 8 is a flow diagram describing fabrication operations in various methods according to embodiments of the present invention. Transferring integrated circuits from the source substrate to the destination substrate is also referred to herein as 'printing' the integrated circuits onto the destination substrate.

Figure 1B:
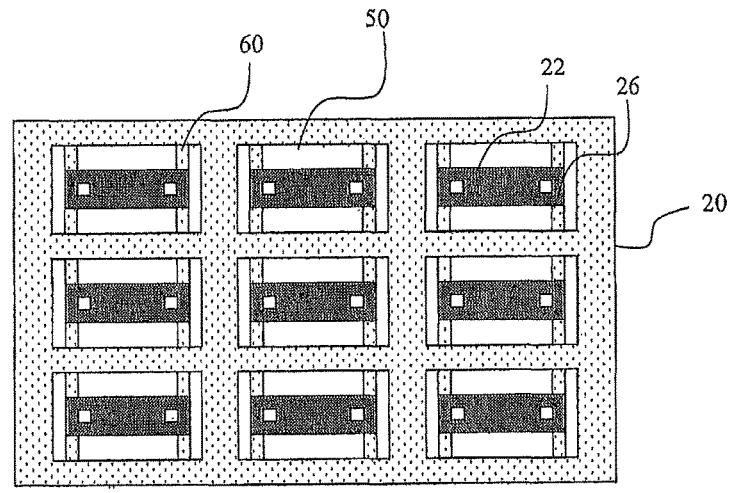
FIG. 1B is a schematic top-view of a source substrate having a plurality of active components having post connections formed on a process side of the source substrate in accordance with embodiments of the present invention.

Referring to the flow diagram of FIG. 8 and to the illustration of FIG. 1A, some embodiments of the present invention provide a source substrate 20 having a process side 24 of the source substrate 20 in step 100. The source substrate 20 can be a wafer having a process side 24 opposite the back side used to handle and transport the wafer. Active components 22 are formed using lithographic processes in an active layer 25 on or in the process side 24 of the source substrate 20. An empty release layer 50 space is formed beneath the active components 22 with tethers 60 connecting the active components 22 to the source substrate 20 in such a way that pressure applied against the active components 22 breaks the tethers 60 to release the active components 22 from the source substrate 20. FIG. 1B is a schematic top-view of the source substrate 20 including the release layer 50, tethers 60, connection posts 26 and active components 22 arranged in a regular, rectangular array. Methods of forming such structures are described, for example, in the paper "AMOLED Displays using Transfer-Printed Integrated Circuits" referenced above. Lithographic processes for forming active components 22 in a source substrate 20, for example transistors, wires, and capacitors, are used in the integrated circuit art. Active components 22 are small integrated circuits, or chiplets, as described further below. The active components 22 can have a thin substrate, for example less than or equal to 25 microns, less than or equal to 15 microns, or less than or equal to 10 microns.

According to various embodiments of the present invention, the source substrate 20 can be provided with the active components 22, release layer 50, tethers 60, and connection posts 26 already formed, or they can be constructed as part of the process of the present invention in step 100.

Figure 1C:
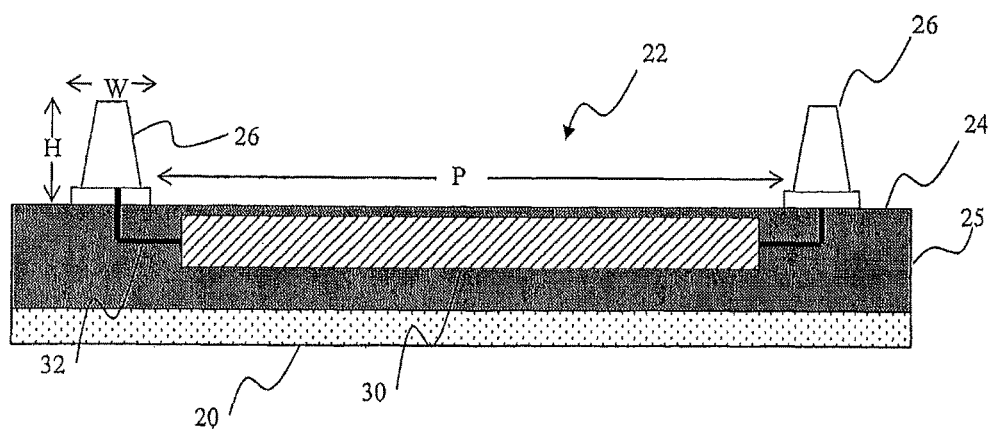
FIG. 1C is a schematic cross-section of an active component having post connections in accordance with embodiments of the present invention.
Figure 1D:
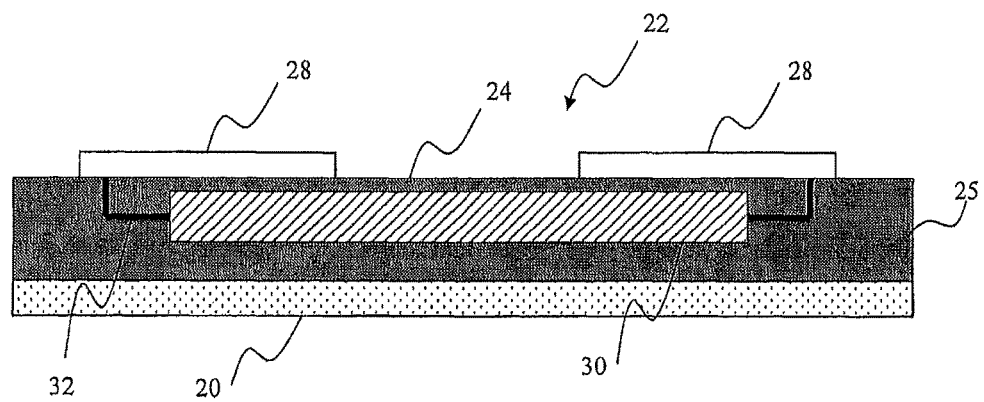
FIG. 1D is a schematic cross-section of an active component having pad connections in accordance with embodiments of the present invention.

Referring to FIGS. 1C and 1D, the active components 22 include electronic circuits 30 formed using lithographic processes and can include electrical connections such as wires 32 to the connection posts 26. Connection posts 26 are illustrated in FIG. 1C and connection pads 28 in FIG. 1D. Connection pads 28 are planar electrical connections formed on the surface of the active component 22 and process side 24 of the source substrate 20. Such connection pads 28 are typically formed from metals such as aluminum or polysilicon using masking and deposition processes used in the art. The connection pads 28 are electrically connected to the circuit 30 with wires 32. In some embodiments, connection pads 28 and the circuit 30, together with other functional structures formed in the active layer 25 on the source substrate 20 make up the active component 22, or chiplet.

Connection posts 26 are electrical connections formed on the surface of the active component 22 and process side 24 of the source substrate 20 that extend perpendicularly to the process side 24 surface. Such connection posts 26 are also formed from metals such as aluminum, titanium, tungsten, copper, silver, gold, or other conductive metals and can be formed by repeated masking and deposition processes that build up three-dimensional structures. In some embodiments, the connection posts 26 are made of one or more high elastic modulus metals, for example tungsten. As used herein, a high elastic modulus is an elastic modulus sufficient to maintain the function and structure of the connection post 26 when pressed into a destination substrate contact 16, as described further below. Such structures can also be made by forming a layer above the active component 22 surface, etching a well into the surface, filling it with a conductive material such as metal, and then removing the layer. Processes for making three-dimensional structures are used in the art. In some embodiments, the post connections 26 are electrically connected to the circuit 30; post connections 26 and the circuit 30, together with other functional structures formed in the active layer 25 on the source substrate 20 make up the active component 22.

Figure 1E:
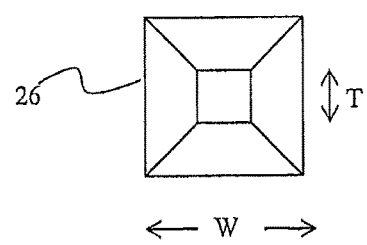
FIG. 1E is a schematic top-view of an example connection post in accordance with embodiments of the present invention.

Referring to FIGS. 1C and 1E, the connection posts 26 can have a base width W representing a planar dimension of the connection post 26 on the process side 24 and a height H representing the extent of the connection post 26 from the process side 24 to the peak of the connection post 26. The base of the connection post 26 can have a base area, for example $W^2$ for a square base, of the area of the connection post 26 in contact with the process side 24 and a peak area, for example a peak area equal to $T^2$ for a square peak, of the area of the connection post 26 farthest from the process side 24. According to some embodiments of the present invention, the connection post 26 has a base area greater than the peak area. The connection post 26 can also have a height greater than a base dimension. In some embodiments of the present invention, the connection posts have a sharp point.

In step 105 of FIG. 8, a first stamp 90 is provided having a plurality of first pillars 92 formed thereon and spatially aligned to the active components 22, each first pillar 92 having a first area. The first stamp 90 can be made of an elastomeric material, such as PDMS. The first pillars 92 protrude from the first stamp 90 surface. The first pillars 92 are spatially arranged on the surface of the first stamp 90 so that each first pillar 92 can be aligned with an active component 22 on the source wafer 20. In some embodiments of the present invention, each active component 22in an array of active components 22 spatially corresponds to a first pillar 92. In another embodiment, a subset of the active components 22 spatially corresponds to a first pillar 92.

Figure 2A:
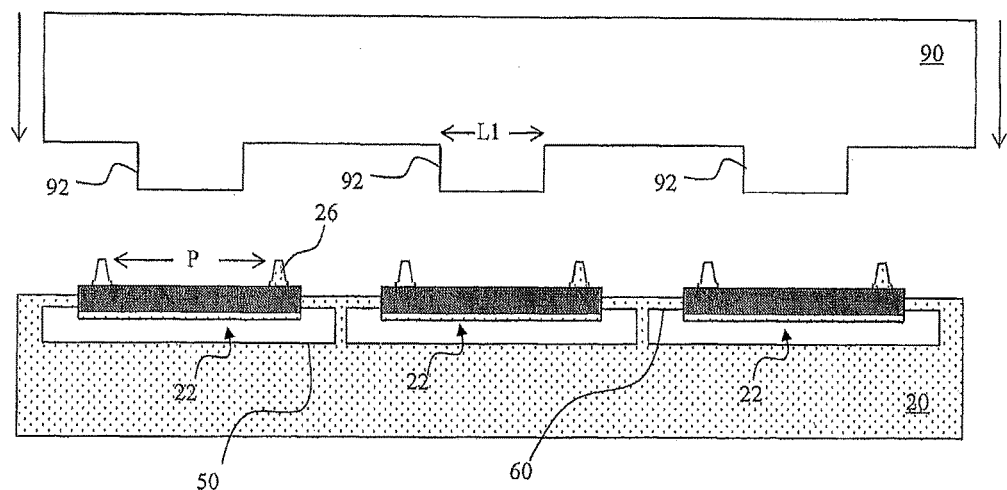
FIG. 2A is a schematic of a stamp and source substrate in accordance with embodiments of the present invention.
Figure 2B:
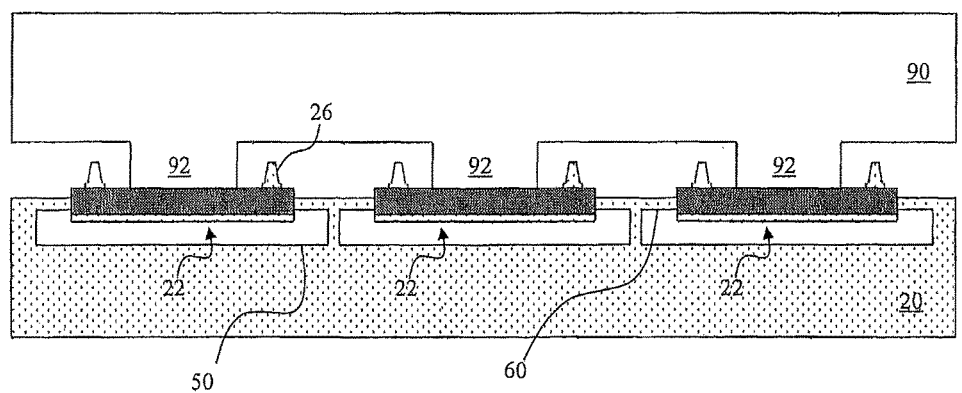
FIG. 2B is a schematic of a stamp in alignment with a source substrate in accordance with embodiments of the present invention.
Figure 2C:
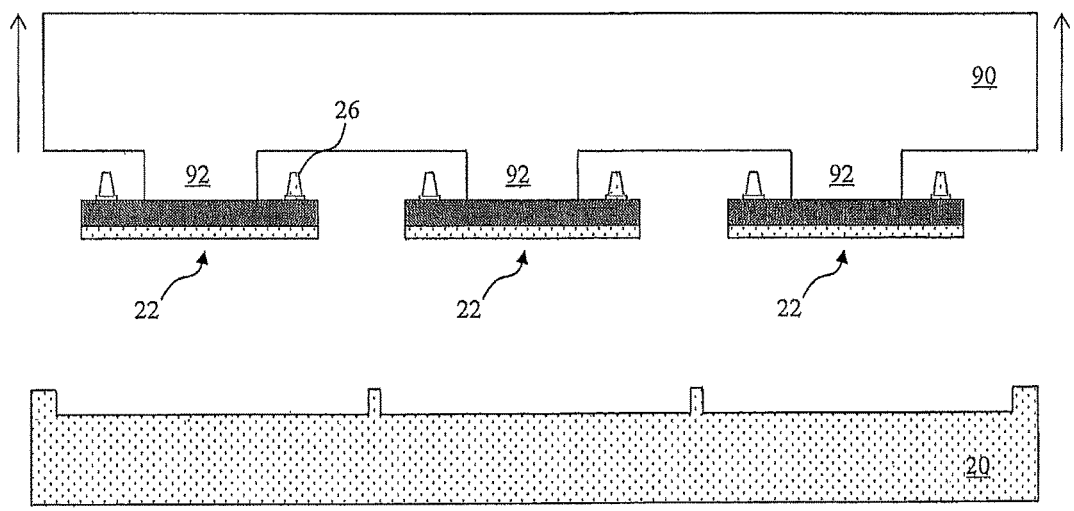
FIG. 2C is a schematic of a stamp and source substrate in accordance with embodiments of the present invention.
Figure 2D:
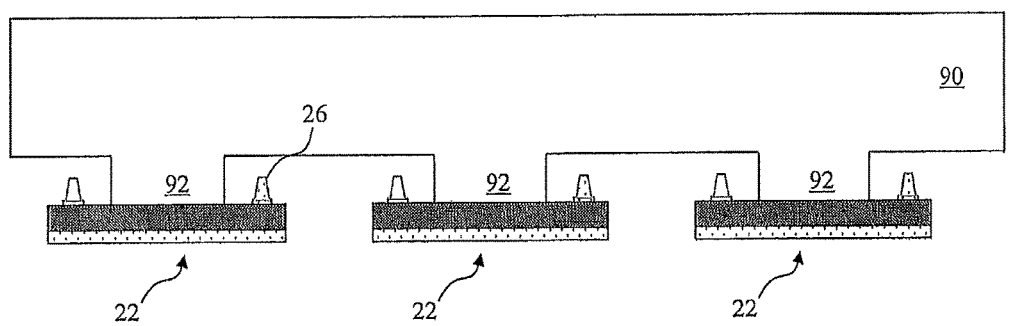
FIG. 2D is a schematic of a stamp with adhered active components in accordance with embodiments of the present invention.

In step 110 of FIG. 8 and as shown in FIG. 2A, the first pillars 92 are pressed against corresponding active components 22 into the release layer 50 to adhere the active components 22 to the first pillars 92 to transfer the pressed active components 22 from the source substrate 20 to first stamp pillars 92 (FIG. 2B). By pressing the first stamp 90 against the active components 22, the tethers 60 are broken and the active components 22 are adhered to the first pillars 92, for example by van der Waal's forces. The first stamp 90 is removed from the source substrate 20 (FIG. 2C), leaving the active components 22 adhered to the first pillars 92 (FIG. 2D).

In some embodiments of the present invention, the first pillars 92 have a planar dimension L1, for example a width, smaller than the distance P between the connection posts 26 on the active components 22 (FIG. 2A). Thus, the first pillars 92 fit between the connection posts 26 to make intimate contact with the surface of the active components 22 to enhance the adhesive effect of the van der Waal's forces and improve adhesion between the active components 22 and the first pillars 92. If the first pillars 92 were located over the connection posts 26, the connection posts 26 would form a standoff between the active components 22 and the first pillars 92, greatly decreasing the attractive force of the van der Waal's force between the active components 22 and the first pillars 92.

Figure 3A:
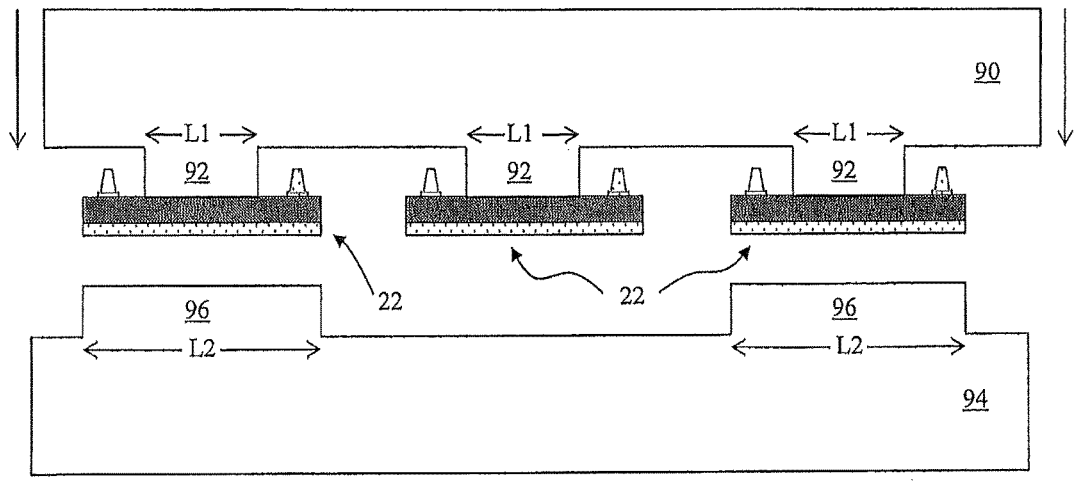
FIG. 3A is a schematic of a first stamp with adhered active components and a second stamp in accordance with embodiments of the present invention.

Referring to step 115 of FIG. 8 and as shown in FIG. 3A, a second or intermediate stamp 94 having second pillars 96 is provided. In some embodiments of the present invention, the second pillars 96 are made of the same material as the first pillars 92. In other embodiments of the present invention, the second pillars 96 are made of a different material than the first pillars 92. In some embodiments of the present invention, the second pillars 96 form vacuum collets 98.

Figure 3B:
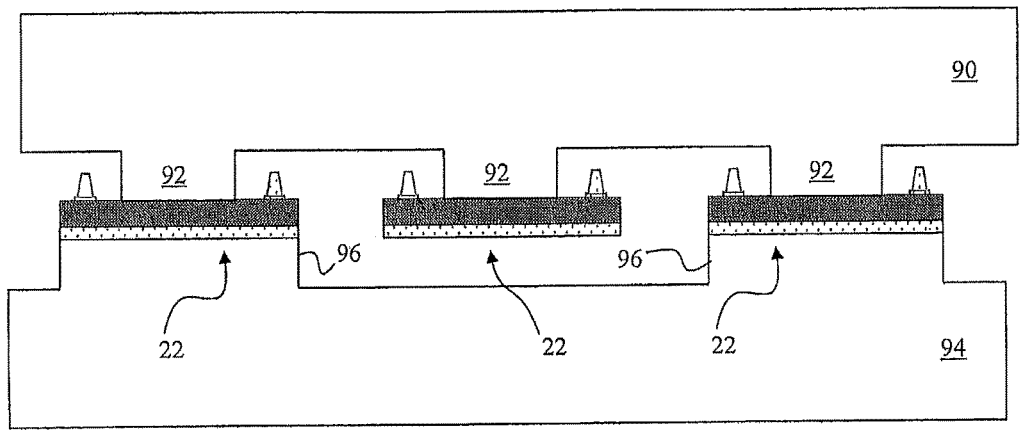
FIG. 3B is a schematic of a first stamp with adhered active components in alignment with a second stamp in accordance with embodiments of the present invention.
Figure 3C:
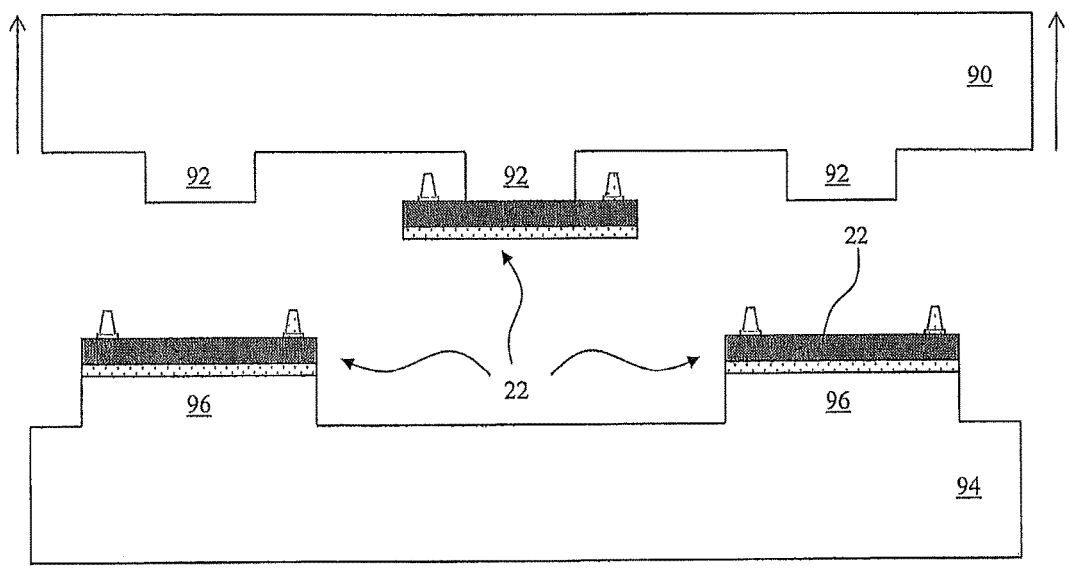
FIG. 3C is a schematic of a first stamp with adhered active components and a second stamp in accordance with embodiments of the present invention.
Figure 3D:
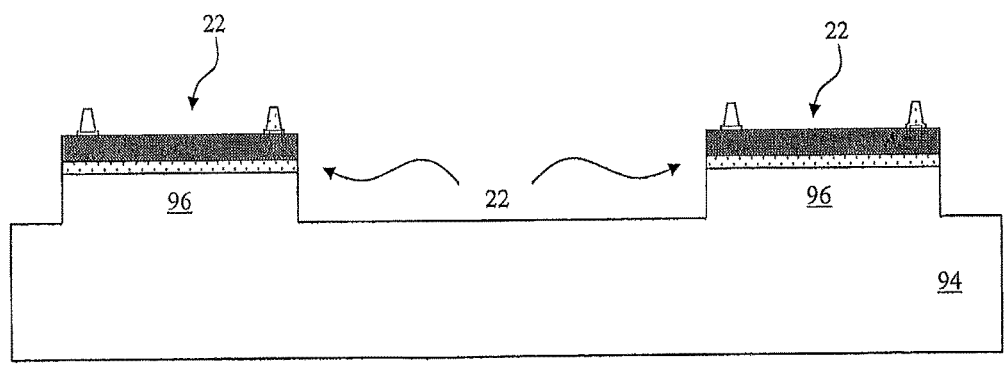
FIG. 3D is a schematic of a second stamp with adhered active components in accordance with embodiments of the present invention.

If the first and second pillars 92, 96 are made of the same material, the second pillars 96 can have a larger surface area than the first pillars 92. As shown in FIG. 3A, the second pillars 96 have at least one planar dimension width L2 that is larger than one of the planar dimensions L1 of the first pillars 92. As shown in FIG. 3B, the active components 22 adhered to the first pillars 92 are brought into contact with the second pillars 96. Because the area of the second pillars 96 is larger than the area of the first pillars 92, the van der Waal's forces between the active components 22 and the second pillars 96 is greater than the van der Waal's forces between the active components 22 and the first pillars 92. Therefore, the active components 22 will transfer (step 120) to the second pillars 96 when the first stamp 90 is removed (FIG. 3C) leaving the active components 22 adhered to the second pillars 96 of the second stamp 94 (FIG. 3D). If the first and second pillars 92, 96 are made of different material, the second pillars 96 should have a surface area sufficient to transfer the active components 22 to the second pillars 96 from first pillars 92. If the second pillars 96 form a vacuum collet, the vacuum collet 98 must be small enough to contact single active components 22 and the vacuum must be strong enough to remove the contacted single active component 22 from the first pillar 92 and transfer it to the second pillar 96.

As illustrated in FIGS. 3A-3D, the first stamp 90 has more first pillars 92 than the second stamp 94 has second pillars 96. Thus, not all of the active components 22 on the first pillars 92 will transfer to the second pillars 96. The second stamp 94 can be laterally translated with respect to the first stamp 90 to sequentially transfer subsets of the active components 22 from the first pillars 92 to the second pillars 96. Since the first pillars 92 are spatially aligned to the active components 22 on the source substrate 20, to enable a sparser distribution of active components 22 on the second stamp 94, the second stamp 94 can have fewer second pillars 96 than first pillars 92 so as to spatially distribute the active components 22 farther apart.

Figure 3E:
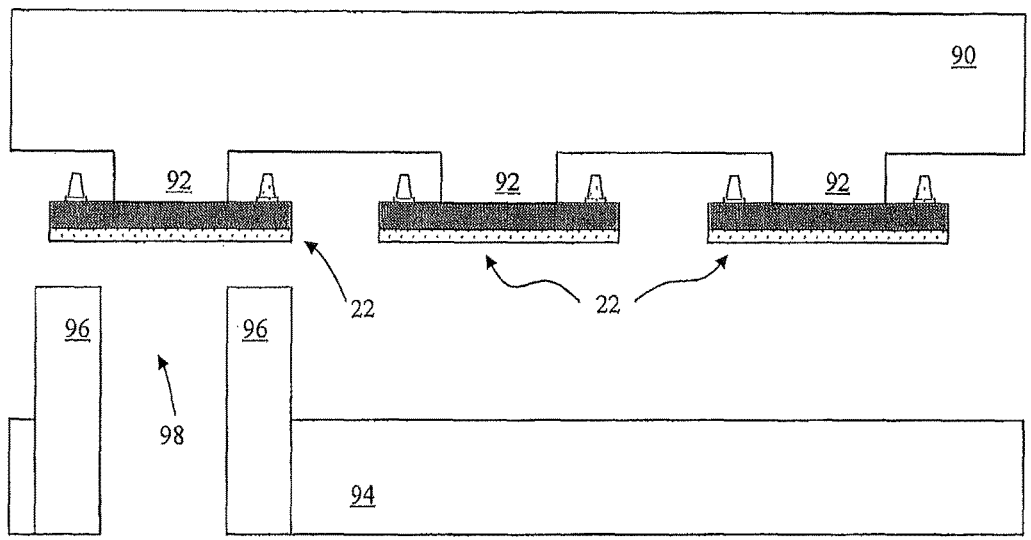
FIG. 3E is a schematic of a second stamp employing a vacuum collet to adhere an active component in accordance with embodiments of the present invention.
Figure 3F:
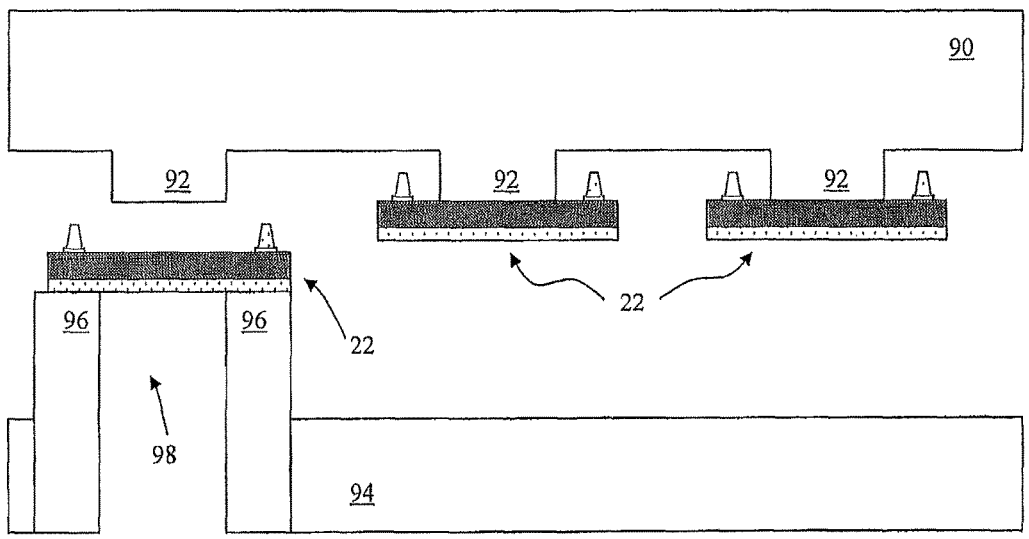
FIG. 3F is a schematic of a second stamp with a vacuum-adhered active component in accordance with embodiments of the present invention.
Figure 3G:
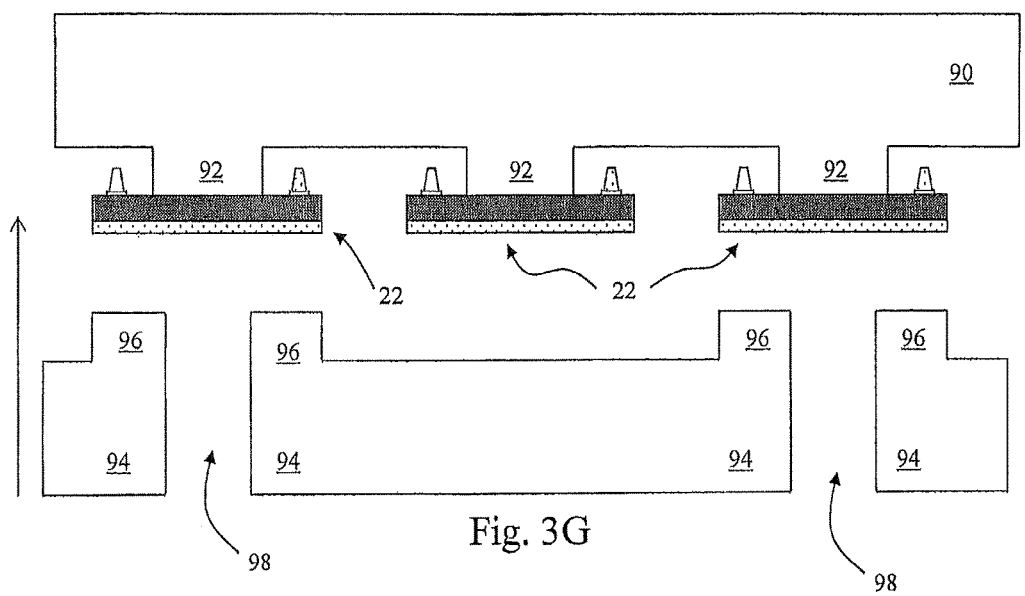
FIG. 3G is a schematic of a second stamp employing a vacuum collet to adhere active components in accordance with embodiments of the present invention.
Figure 3H:
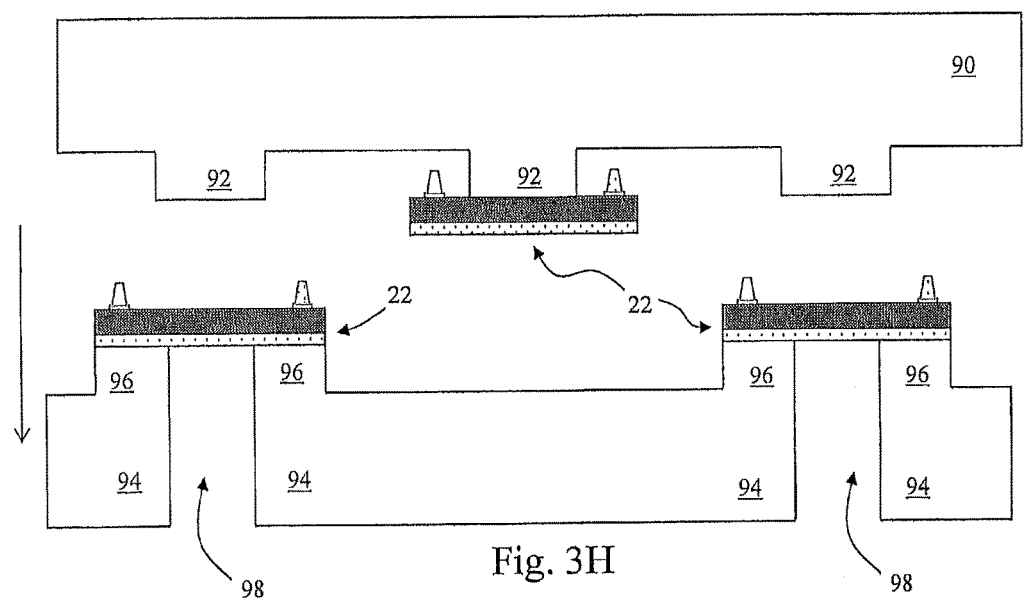
FIG. 3H is a schematic of a second stamp with vacuum-adhered active components in accordance with embodiments of the present invention.

As illustrated in FIGS. 3E and 3F, a second stamp 94 can include second pillars 96 that form vacuum collets 98. By applying a vacuum (or partial vacuum) to the vacuum collets 98, the active components 22 can be transferred to the second stamp 94. As shown in FIG. 3E, the second stamp 94 is aligned with the first stamp 90, vacuum is applied to the vacuum collet 98, and the second stamp 94 is removed from the first stamp 90, leaving the active component 22 associated with the second pillar 96 adhered to the second pillar 96 (FIG. 3F). The illustrations of FIGS. 3E and 3F employ a single second pillar 96 vacuum collet 98. In another embodiment of the present invention, and as illustrated in FIGS. 3G and 3H, a plurality of second pillars 96 can have vacuum collets 98. As shown in FIG. 3G, the second stamp 94 is aligned with the first stamp 90, vacuum is applied to the plurality of vacuum collets 98, and the second stamp 94 is removed from the first stamp 90, leaving the active components 22 associated with the second pillars 96 adhered to the second pillars 96 (FIG. 3F).

The spatial distribution of the active components 22 is a matter of design choice for the end product desired. In one embodiment of the present invention, all of the active components 22 in a source substrate 20 array are transferred to the first stamp 90. In another embodiment, a subset of the active components 22 in the source substrate 20 array is transferred. Similarly, in some embodiments of the present invention, all of the active components 22 on the first pillars 92 of the first stamp 90 array are transferred to the second pillars 96 of the second stamp 94. In another embodiment, a subset of the active components 22 on the first pillars 92 of the first stamp 90 are transferred to the second pillars 96 of the second stamp 90. By varying the number and arrangement of first and second pillars 92, 96 on the first and second stamps 90, 94, the distribution of active components 22 on the second pillars 96 of the second stamp 94 can be likewise varied.

Figure 4A:
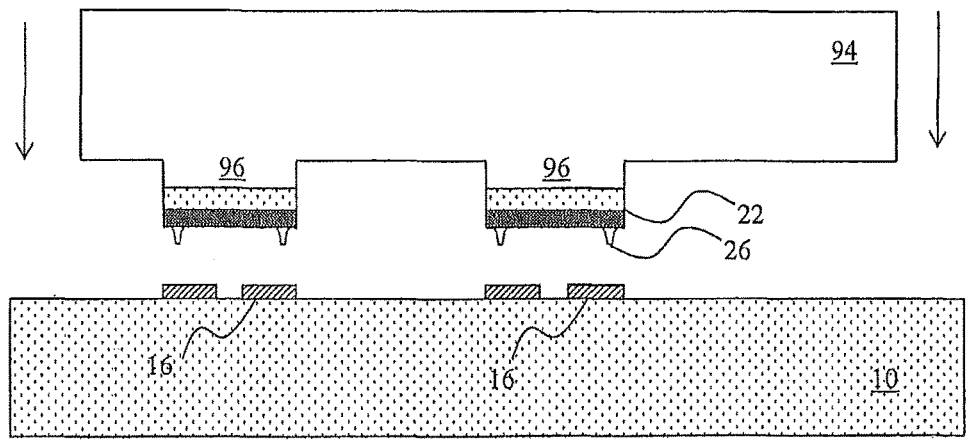
FIG. 4A is a schematic of a second stamp with adhered active components and a destination substrate in accordance with embodiments of the present invention.
Figure 4B:
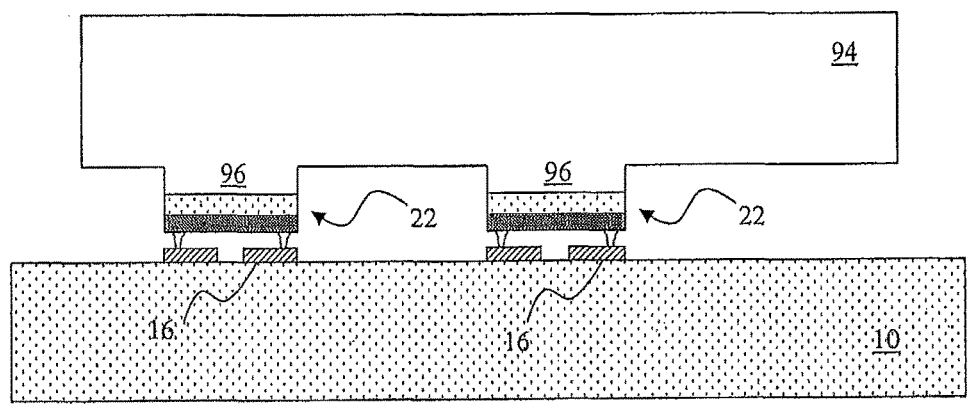
FIG. 4B is a schematic of a second stamp with adhered active components in alignment with a destination substrate in accordance with embodiments of the present invention.
Figure 4C:
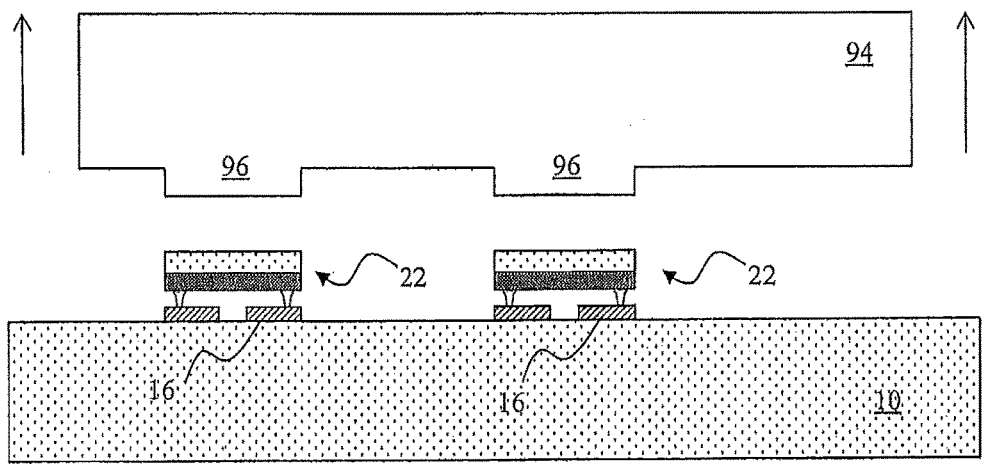
FIG. 4C is a schematic of a second stamp with adhered active components and a destination substrate in accordance with embodiments of the present invention.
Figure 4D:
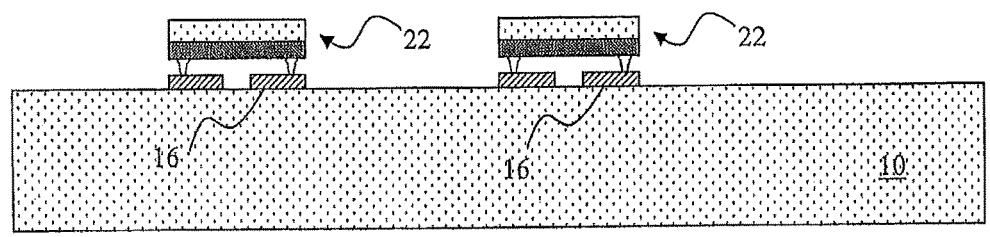
FIG. 4D is a schematic of a destination substrate with adhered active components in accordance with embodiments of the present invention.

In a further embodiment of the present invention, referring to step 125 of FIG. 8, a destination substrate 10 is provided. An optional adhesive layer 18 (FIG. 6) can be coated over the destination substrate 10 (optional step 130). As shown in FIG. 4A, the active components 22 on the second pillars 96 of the second stamp 94 are brought into alignment with the destination substrate 10 and pressed onto the destination substrate 10 (FIG. 4B). The second stamp 94 is then removed (FIG. 4C) leaving the active components 22 adhered to the destination substrate 10 (FIG. 4D) (step 135).

As shown in FIGS. 4A-4D, the destination substrate 10 can include destination substrate contacts 16. The destination substrate contacts 16 can be electrically conductive and connected through wires or conductive traces to other components or structures on the destination substrate 10. If the active components 22 include protruding connection posts 26, and the active components 22 are aligned with the destination substrate 10 so that the connection posts 26 are aligned with the destination substrate contacts 16, the connection posts 26 can electrically contact the destination substrate pads and electrically connect the active component circuit 30 to electronic components on the destination substrate 10. By pressing the connection posts 26 of the second stamp 94 with sufficient mechanical pressure against the destination substrate contacts 16, the connection posts 26 can be driven through a surface of the destination substrate contacts 16 into the destination substrate contacts 16 to form a robust electrical contact with the destination substratecontacts16. A sufficient mechanical pressure can be an amount of force needed to cause the destination substrate contact 16 to plastically deform as the connection post 26 is pressed into it. Thus, in this embodiment, the connection posts 26 on the active components 22 may have sharp points and/or a high elastic modulus, for example, by incorporating tungsten. A connection post 26 can have a sharp point, for example, if the top of the post has an area less than 10 microns square, less than 5 microns square, or less than 1 micron square. The destination substrate contacts 16 can also provide adhesion to help adhere the active components 22 to the destination substrate 10.

Figure 5:
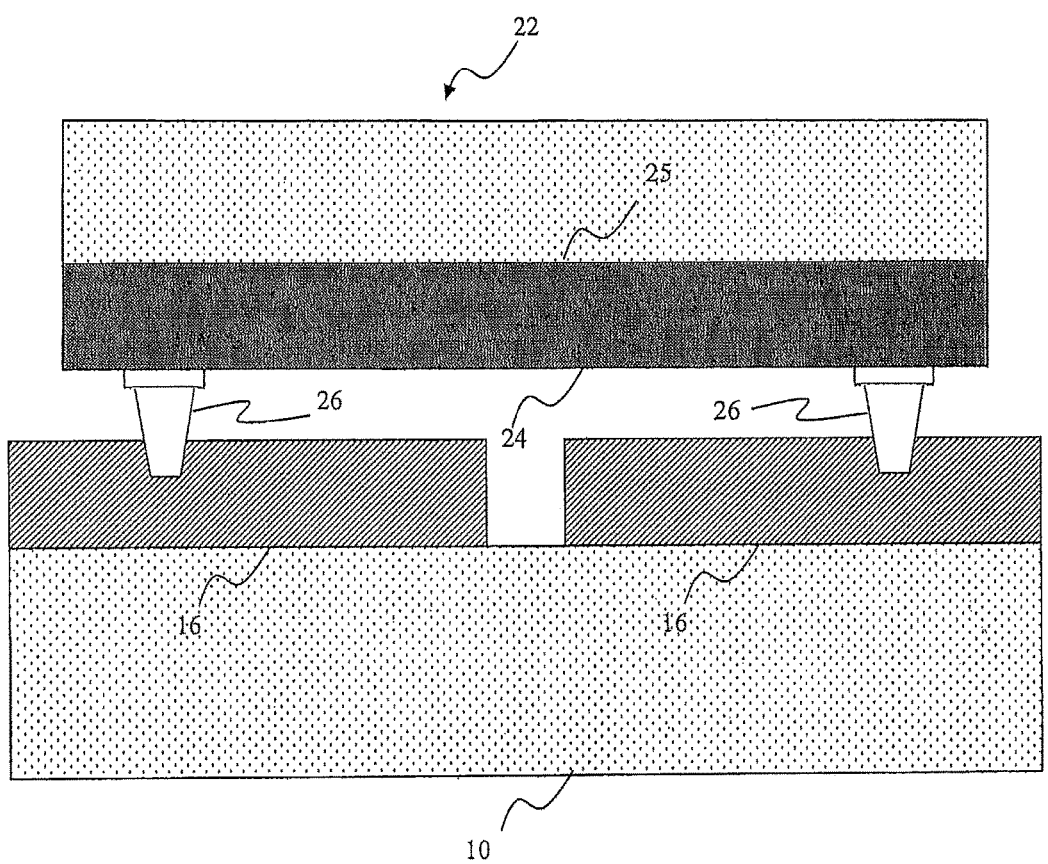
FIG. 5 is a schematic cross-section of an active component and electrical contacts on a destination substrate in accordance with embodiments of the present invention.

Referring to FIG. 5, the destination substrate contacts 16 can be made of a relatively soft metal, such as tin, solder, or tin-based solder, to assist in forming good electrical contact with the connection posts 26 and adhesion with the active components 22. As used herein, a soft metal may refer to a metal into which a connection post 26 can be pressed to form an electrical connection between the connection post 26 and the destination substrate contact 16. In this arrangement, the destination substrate contact 16 can plastically deform and flow under mechanical pressure to provide a good electrical connection between the connection post 26 and the destination substrate contact 16. In a further method of the present invention, the destination substrate contacts 16 (or connection posts 26) are heated, causing the destination substrate pad metal to reflow and improve adhesion between the active components 22 and the destination substrate 10 and improve the electrical connection to the connection posts 26.

In another embodiment of the present invention, the connection posts 26 can include a soft metal and the destination substrate contacts 16 include a high elastic modulus metal. In this arrangement, the connection posts 26 can plastically deform and flow under mechanical pressure to provide a good electrical connection between the connection post 26 and the destination substrate contact 16.

Figure 6:
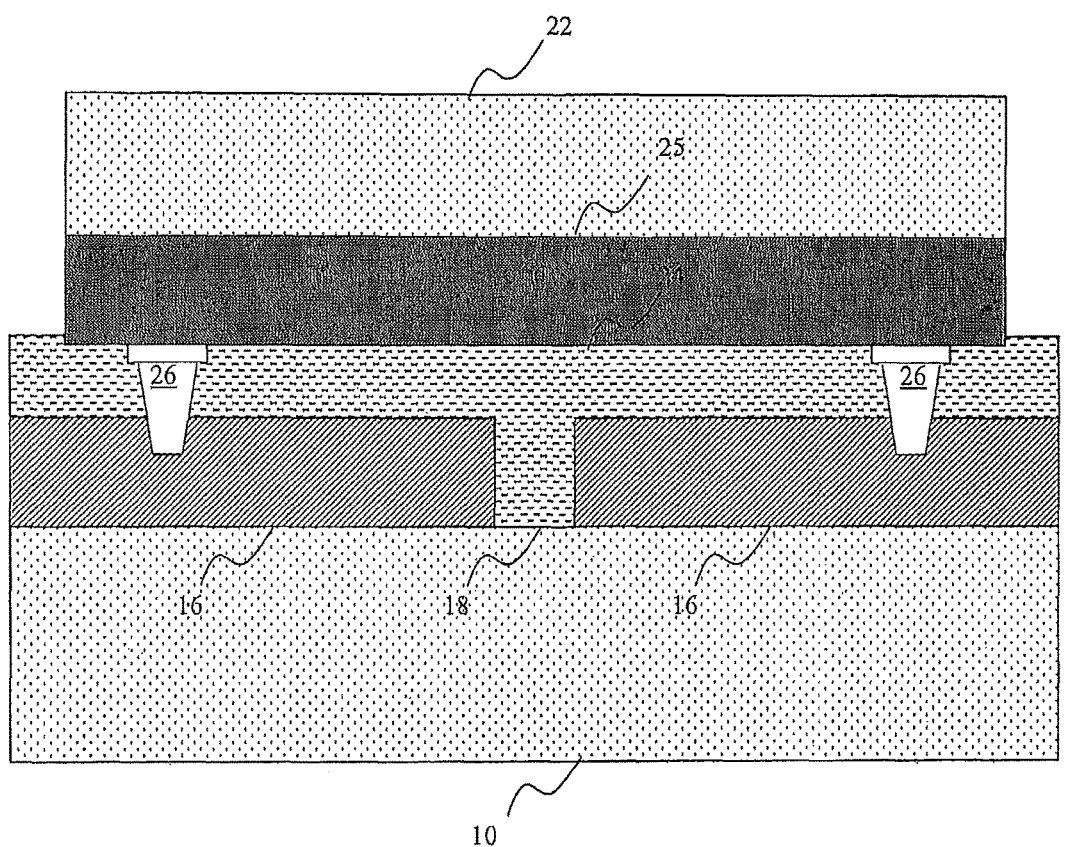
FIG. 6 is a schematic cross-section of an active component and electrical contacts with an adhesive layer on a destination substrate in accordance with embodiments of the present invention.

Referring to FIG. 6, if the optional adhesive layer 18 is formed on the destination substrate 10, the connection posts 26 can be driven through the adhesive layer 18 to form an electrical connection with the destination substrate contacts 16 beneath the adhesive layer 18. The adhesive layer 18 can be cured to more firmly adhere the active components 22 to the destination substrate 10 and maintain a robust electrical connection between the connection posts 26 and destination substrate contacts16 in the presence of mechanical stress. The adhesive layer 18 can undergo some shrinkage during the curing process that can further strengthen the electrical connectivity and adhesion between the connection post 26 and the destination substrate contacts 16.

Figure 7:
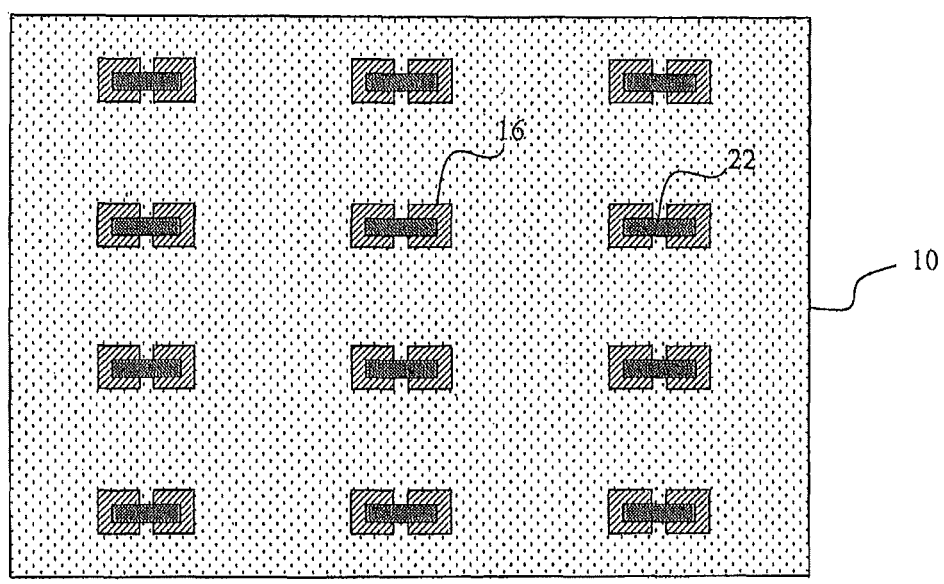
FIG. 7 is a schematic top-view of an active component and electrical contacts on a destination substrate in accordance with embodiments of the present invention.
Figure 8:
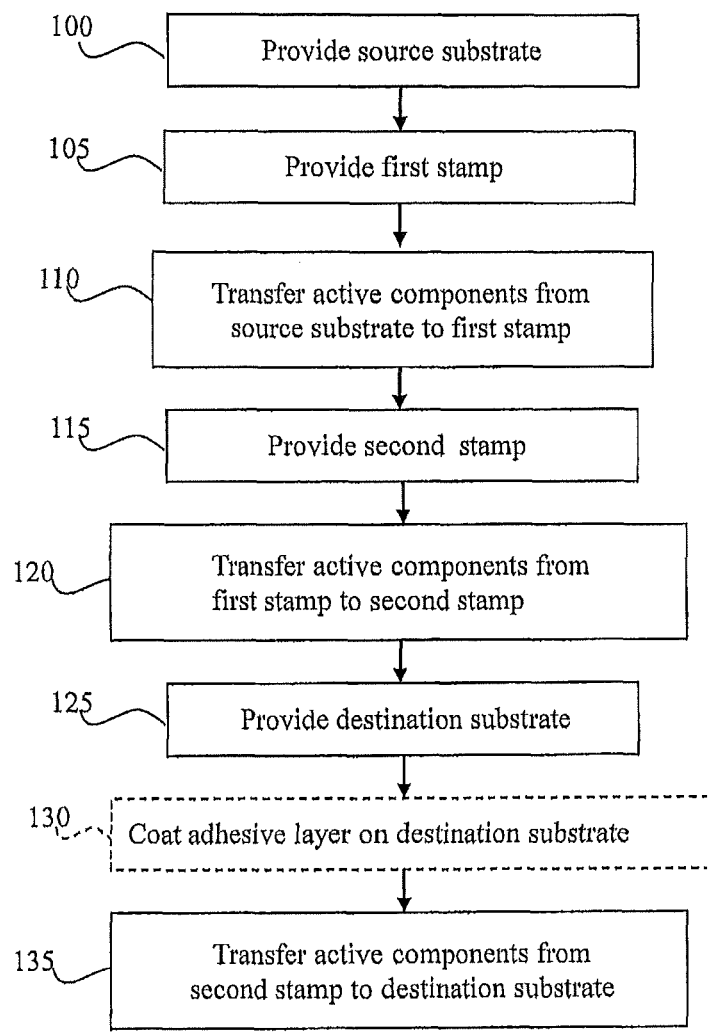
FIG. 8 is a flow diagram illustrating methods in accordance with embodiments of the present invention.

FIG. 7 provides a top view of the destination substrate 10 with destination substrate contacts16 after the active components 22 are adhered to the destination substrate 10.

Thus, methods of the present invention include selectively transferring active components from a source substrate to a destination substrate by providing a source substrate 20 having a process side 24 and a plurality of active components 22 formed on or in the process side 24 of the source substrate 20. A first stamp 90 having a plurality of first pillars 92 formed thereon is spatially aligned to the active components 22. Each first pillar 92 has a first area. The first pillars 92 are pressed against corresponding active components 22 to adhere the active components 22 to the first pillars 92. A second stamp 94 having a plurality of second pillars 96 is spatially aligned to the first pillars 92. Each second pillar 94 has a second area greater than the first area. The second pillars 96 are pressed against corresponding active components 22 to adhere the active components 22 to the second pillars 96. The active components 22 are pressed against the destination substrate 10 to adhere the active components 22 to the destination substrate 10.

According to another embodiment of the present invention, an active component 22 includes a substrate having a process side 24 and a circuit 30 formed on the process side 24. Connection posts 26 are formed on the process side 24 and electrically connected to the circuit 30. The connection posts 26 have a base width, a height, a base area, and a peak area. The height is greater than the base width and the peak area is less than the base area.

In yet another embodiment of the present invention, an electronically active substrate includes a destination substrate 10 having a plurality of destination substrate contacts 16. The destination substrate contacts 16 have a surface. A plurality of active components 22 are distributed over the destination substrate 10. Each active component 22 includes a component substrate different from the destination substrate 10. Each active component 22 has a circuit 30 and connection posts 26 formed on a process side 24 of the component substrate. The connection posts 26 have a base width and a height that is greater than the base width. The connection posts 26 are in electrical contact with the circuit30 and the destination substrate contacts 16. The connection posts 26 are driven through the surface of the destination substrate contacts 16 into the destination substrate contacts 16 to electrically connect the connection posts 26 to the destination substrate contacts 16.

In another embodiment, an adhesive layer 18 is formed over the destination substrate 10 between the active components 22 and the destination substrate 10, so that the connection posts 26 pass through the adhesive layer 18 into the destination substrate contacts 16. The adhesive layer 18 can be a curable adhesive layer and the adhesive layer can be cured to adhere the active components 22 to the destination substrate 10.

According to one embodiment of the present invention, the source substrate 20 can be provided with active components 22 and connection pads 28 or connection posts 26 already formed on the process side 24 of the source substrate 20. Alternatively, an unprocessed source substrate 20 can be provided and the active components 22 formed on the process side 24 of the source substrate 20. An unprocessed source substrate 20 is a substrate that does not yet include active components 22. The unprocessed source substrate 20 can have other processing steps completed, for example, cleaning, deposition of material layers, or heat or chemical treatments, as are used in the photo-lithographic arts. Active components 22 are formed, for example using photo-lithographic processes including forming masks over the source substrate 20, etching materials, removing masks, and depositing materials. Such processes are used in the photo-lithographic arts. Using such processes, active components 22 are formed on or in the process side 24 of the source substrate 20.

Active components 22 are small electronic integrated circuits, for example, having a size of about 5 microns to about 5000 microns in a dimension. The electronic circuits can include semiconductor materials (for example inorganic materials such as silicon or gallium arsenide, or inorganic materials) having various structures, including crystalline, microcrystalline, polycrystalline, or amorphous structures. The active components 22 can also include insulating layers and structures such as silicon dioxide, nitride, and passivation layers and conductive layers or structures including wires made of aluminum, titanium, silver, or gold that form an electronic circuit. Connection posts 26 or connection pads 28 can be formed of metals such as aluminum or polysilicon semiconductors and can be located on the top surface of the active components 22. Methods and materials for making active component 22 electronic circuits are used in the integrated circuit arts. Large numbers of such small integrated circuits are formed on a single source substrate 20. The active components 22 are typically packed as closely as possible to use the surface area of the source substrate 20 as efficiently as possible.

Embodiments of the present invention provides advantages over other printing methods described in the prior art. By employing connection posts 26 on active components 22 and a printing method that provides active components 22 onto a destination substrate 10 with the process side 24 and connection posts 26 adjacent to the destination substrate 10, a low-cost method for printing chiplets in large quantities over a destination substrate 10 is provided. Furthermore, additional process steps for electrically connecting the active components 22 to the destination substrate 10 are obviated.

The source substrate 20, first stamp 90, second stamp 94, and destination substrate 10 can be made separately and at different times or in different temporal orders or locations and provided in various process states.

In some embodiments, the active components 22 are small integrated circuits formed in a semiconductor wafer source substrate 20, for example gallium arsenide or silicon, which can have a crystalline structure. Processing technologies for these materials typically employ high heat and reactive chemicals. However, by employing transfer technologies that do not stress the active component 22 or substrate materials, more benign environmental conditions can be used compared to thin-film manufacturing processes. Thus, the present invention has an advantage in that flexible substrates that are intolerant of extreme processing conditions (e.g. heat, chemical, or mechanical processes) can be employed for the destination substrates 10. Furthermore, it has been demonstrated that crystalline silicon substrates have strong mechanical properties and, in small sizes, can be relatively flexible and tolerant of mechanical stress. This is particularly true for substrates of 5 micron, 10 micron, 20 micron, 50 micron, or even 100-micron thicknesses. Alternatively, the active components 22 can be formed in a microcrystalline, polycrystalline, or amorphous semiconductor layer.

The active components 22 can be constructed using foundry fabrication processes used in the art. Layers of materials can be used, including materials such as metals, oxides, nitrides and other materials used in the integrated-circuit art. Each active component 22 can be a complete semiconductor integrated circuit and can include, for example, transistors. The active components 22 can have different sizes, for example, 1000 square microns or 10,000 square microns, 100,000 square microns, or 1 square mm, or larger, and can have variable aspect ratios, for example 1:1, 2:1, 5:1, or 10:1. The active components 22 can be rectangular or can have other shapes.

The first and second stamps 90, 94 can be structured, for example with pillars 92 matched to the shapes, sizes, and locations of the active components 22 to enhance adhesion. The first and second stamps 90, 94 can be elastomeric, for example made of polydimethylsiloxane (PDMS), rubber, or a reinforced composite.

The adhesion between the active components 22 and the receiving side 12 of the destination substrate 10 should be greater than the adhesion between the active components 22 and the second stamp 94. As such, when the second stamp 94 is removed from the receiving side 12 of the destination substrate 10, the active components 22 adhere more strongly to the receiving side 12 than to the second stamp 94, thereby transferring the active components 22 from the second stamp 94 to the receiving side 12 of the destination substrate 10.

Referring to the flow diagrams of FIG. 8, the method of the present invention can be iteratively applied to a single or multiple destination substrates 10. By repeatedly transferring sub-arrays of active components 22 from a second stamp 94 to a destination substrate 10 and relatively moving the second stamp 94 and destination substrates 10 between stamping operations by a distance equal to the spacing of the selected active components 22 in the transferred sub-array between each transfer of active components 22, an array of active components 22 formed at a high density on a source substrate 20 can be transferred to a destination substrate 10 at a much lower density. In practice, the source substrate 20 is likely to be expensive, and forming active components 22 with a high density on the source substrate 20 will reduce the cost of the active components 22, especially as compared to forming active components on the destination substrate 10. Transferring the active components 22 to a lower-density destination substrate 10 can be used, for example, if the active components 22 manage elements distributed over the destination substrate 10, for example in a display, digital radiographic plate, or photovoltaic system.

In particular, in the case wherein the active component 22 is an integrated circuit formed in a crystalline semiconductor material, the integrated circuit substrate provides sufficient cohesion, strength, and flexibility that it can adhere to the destination substrate 10 without breaking as the second stamp 94 is removed.

In comparison to thin-film manufacturing methods, using densely populated source substrates 20 and transferring active components 22 to a destination substrate 10 that requires only a sparse array of active components 22 located thereon does not waste or require active layer material on a destination substrate 10. The present invention can also be used in transferring active components 22 made with crystalline semiconductor materials that have higher performance than thin-film active components. Furthermore, the flatness, smoothness, chemical stability, and heat stability requirements for a destination substrate 10 used in embodiments of the present invention may be reduced because the adhesion and transfer process is not substantially limited by the material properties of the destination substrate. Manufacturing and material costs may be reduced because of high utilization rates of more expensive materials (e.g., the source substrate) and reduced material and processing requirements for the destination substrate.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the specification, there have been disclosed embodiments of the invention and, although specific terms are employed, they are used in a generic and descriptive sense only and not for purposes of limitation.

That which is claimed:

1. A method of making a wafer having transfer-printable active components disposed therein or thereon, comprising:
    providing a wafer;
    disposing active components in or on the wafer, the active components each comprising a circuit structure having a post surface and an opposing stamp surface, the circuit structure comprising an electronic circuit;
    disposing a plurality of electrically conductive connection posts on each of the active components, the plurality of connection posts protruding from the post surface, wherein the plurality of connection posts are physically connected to the circuit structure and electrically connected to the electronic circuit; and
    disposing a breakable component tether releasably attaching the circuit structure to the wafer.

2. The method of claim 1, comprising providing a destination substrate comprising a receiving surface and electrical contacts disposed on the receiving surface and transfer printing one or more of the active components from the wafer to the receiving surface of the destination substrate so that each of the conductive connection posts protruding from the post surface of the one or more of the active components is electrically connected to an electrical contact of the electrical contacts.

3. The method of claim 2, comprising transfer printing one or more of the active components from the wafer to the receiving surface of the destination substrate using a stamp so that each of the conductive connection posts protruding from the post surface of the one or more of the active components is electrically connected to an electrical contact of the electrical contacts.

4. The method of claim 2, comprising disposing an adhesive layer on the receiving surface of the destination substrate to adhere the one or more active components to the destination substrate.

5. The method of claim 1, comprising building up a three-dimensional structure to form each of the plurality of connection posts.

6. An active component, comprising:
    a circuit structure comprising an electronic circuit and connection pads, each of the connection pads electrically connected to the electronic circuit;
    an electrically conductive connection post protruding from each of the connection pads and electrically connected to the electronic circuit; and
    a fractured component tether physically connected to the circuit structure.

7. The active component of claim 6, wherein the connection pads are each a planar electrical connection formed on a surface of the circuit structure.

8. The active component of claim 6, wherein the connection post protruding from each of the connection pads has a peak that is a sharp point.

9. The active component of claim 6, wherein the connection post protruding from each of the connection pads has one or more of a height that is greater than its base width, a base width that is greater than its peak width, and a base area that is greater than its peak area.

10. The active component of claim 6, wherein the electronic circuit is one or more of an integrated circuit, a transistor, a capacitor, and a light-emitting diode.

11. The active component of claim 6, wherein a surface of the electronic circuit has a dimension from 5 microns to 5000 microns.

12. A wafer comprising:
    an electronic circuit;
    connection pads electrically connected to the electronic circuit;
    an electrically conductive connection post protruding from each of the connection pads and electrically connected to the electronic circuit; and a breakable component tether releasably attaching the electronic circuit to the wafer.

13. The wafer of claim 12, wherein the connection post protruding from each of the connection pads has one or more of a height that is greater than its base width, a base width that is greater than its peak width, and a base area that is greater than its peak area.

14. The wafer of claim 12, wherein a surface of the electronic circuit has a dimension from 5 microns to 5000 microns.

15. A method of making a wafer having transfer-printable active components disposed thereon or therein, comprising:
   providing a wafer;
   disposing an electronic circuit in or on the wafer;
   disposing connection pads in or on the wafer, each of the connection pads electrically connected to the electronic circuit;
   disposing an electrically conductive connection post protruding from each of the connection pads and electrically connected to the electronic circuit; and
   disposing a breakable component tether releasably attaching the electronic structure to the wafer.

16. The method of claim 15, comprising:
   providing a destination substrate having a receiving surface; and
   transfer printing the electronic circuit from the wafer to the receiving surface of the destination substrate.

17. The method of claim 16, comprising coating an adhesive layer on the receiving surface in order to adhere the transfer printed electronic circuit to the destination substrate.

18. The method of claim 16, comprising building up a three-dimensional structure to form the connection post protruding from each of the connection pads.

19. A printed structure comprising:
   a destination substrate comprising electrical contacts;
   a circuit structure comprising an electronic circuit, connection pads, and a broken tether, wherein each of the connection pads is electrically connected to the electronic circuit; and
   an electrically conductive connection post protruding from each of the connection pads and electrically connected to the electronic circuit,
   wherein the connection post is in electrical contact with, extends into, or extends through an electrical contact of the destination substrate to electrically connect the electrical contact to the connection post.

20. The printed structure of claim 19, wherein the electrical contacts of the destination substrate have a composition softer than that of the connection posts.

21. The printed structure of claim 19, wherein the connection post adheres to the electrical contact of the destination substrate.

* * * * *